United States Patent [19]

Takamine

[11] Patent Number: 4,983,842
[45] Date of Patent: Jan. 8, 1991

[54] IMAGE READING APPARATUS

[75] Inventor: Jun Takamine, Shinmachi, Japan

[73] Assignee: Tokyo Electron Limited, Tokyo, Japan

[21] Appl. No.: 330,352

[22] Filed: Mar. 29, 1989

[30] Foreign Application Priority Data

Mar. 31, 1988 [JP] Japan .................................. 63-79062

[51] Int. Cl.$^5$ .................... G01N 21/00; G01N 21/01; G01N 21/47
[52] U.S. Cl. .................. 250/358.1; 250/360.1; 250/341; 356/446
[58] Field of Search ............. 250/271, 341, 358.1, 250/360.1, 560; 356/376, 446

[56] References Cited

U.S. PATENT DOCUMENTS

| | | | |
|---|---|---|---|
| 4,368,979 | 1/1983 | Ruell | 356/71 |
| 4,502,785 | 3/1985 | Truax | 356/376 |
| 4,615,620 | 10/1986 | Noguchi et al. | 356/378 |
| 4,795,906 | 1/1989 | Adams et al. | 250/341 |

FOREIGN PATENT DOCUMENTS

0119007 9/1980 Japan .................................. 356/376

*Primary Examiner*—Constantine Hannaher
*Assistant Examiner*—Edward J. Glick
*Attorney, Agent, or Firm*—Oblon, Spivak, McClelland, Maier & Neustadt

[57] ABSTRACT

An image reading apparatus comprises a light source for simultaneously radiating, onto a pattern formed by etching a plurality of recessed characters in a semiconductor wafer, an incoherent parallel slit light beam having a radiation spot of dimensions corresponding to those of a region to be measured, a CCD camera, having a light-receiving surface which is shifted from an optical axis of a regular reflection beam so as to receive a reflection beam offset from the regular reflection beam by the region to be measured, for measuring the pattern on the basis of the received beam, and a light-shielding plate, arranged between the light source and the member to be measured, for preventing a peripheral beam of the parallel slit light beam from being incident on the region to be measured.

6 Claims, 3 Drawing Sheets

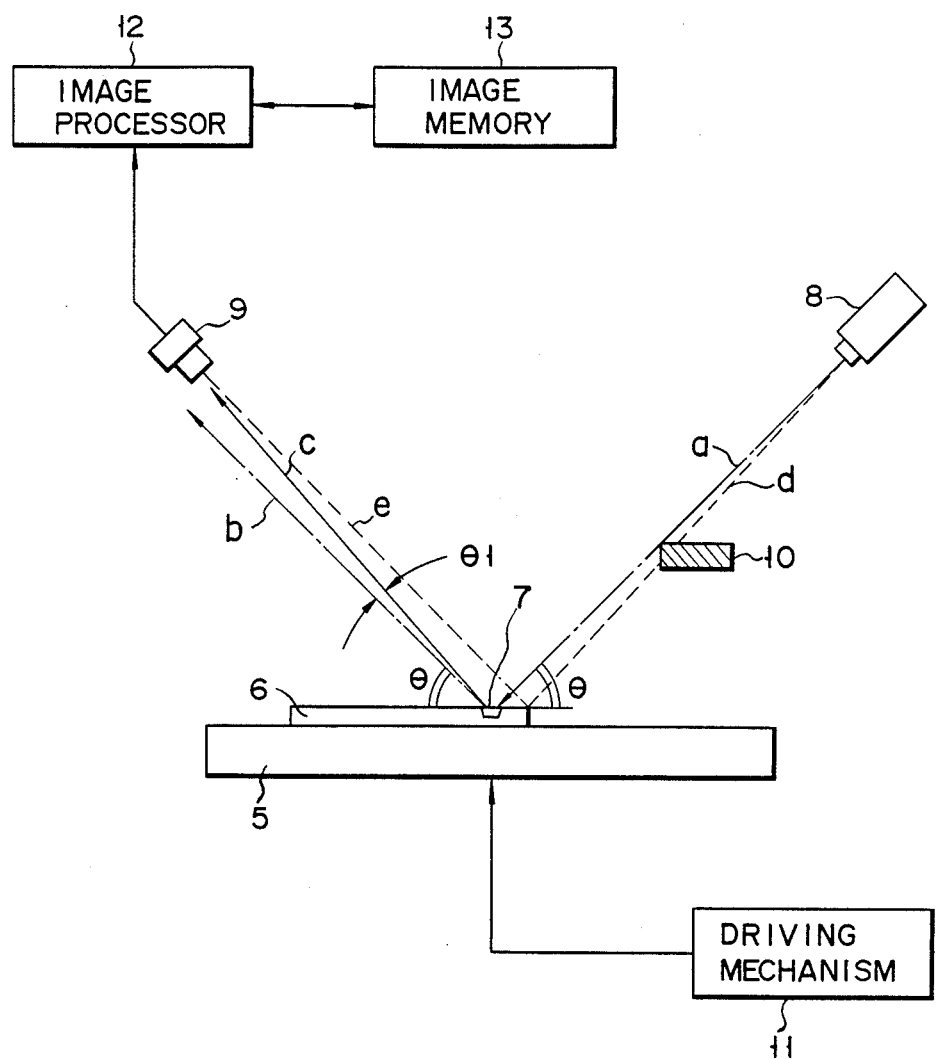
F I G. 1

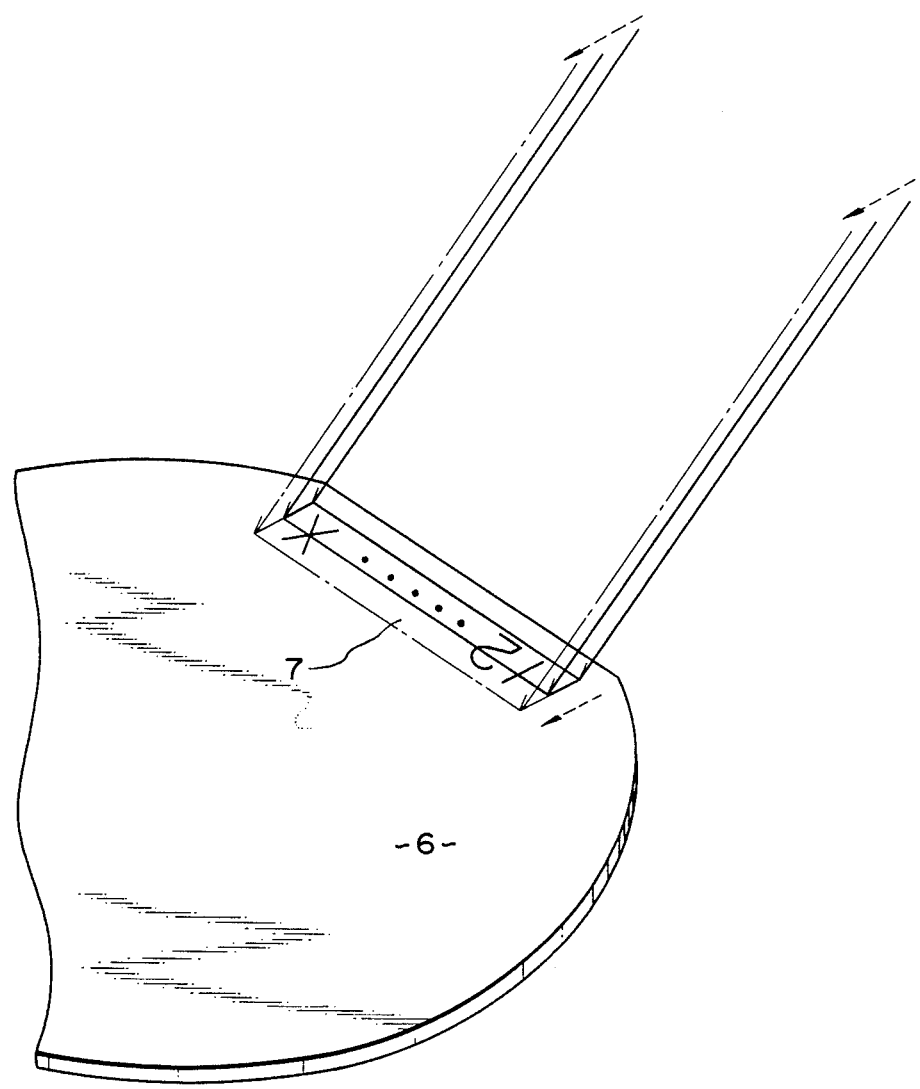
F I G. 2

IMAGE READING APPARATUS

BACKGROUND OF THE INVENTION

1. Field of the Invention

The present invention relates to an image reading apparatus utilizing a light beam.

2. Description of the Related Art

Conventionally, in a fabrication process of a semiconductor, when an alignment between an object to be processed, e.g., a semiconductor wafer and a processing apparatus is performed or a sort of the object is checked, an image of a pattern at a predetermined location of the object is picked up, and alignment and checking of a sort are performed on the basis of the image data.

In such an image reading method of, e.g., an apparatus for reading a sort number etched on a semiconductor wafer, a detection mechanism, e.g., a CCD camera or the like is arranged above an etched position of the sort number of the semiconductor wafer, so that a measurement beam is incident on the etched position, and a reflection beam is sensed by the CCD camera. The image data picked up by the CCD camera is compared with prestored image data to check the sort.

In the conventional image reading method by means of dark field measurement, if a diffuse-reflecting thin film, e.g., an Al film is formed on a semiconductor wafer, considerable irregular reflection occurs, resulting in a considerable decrease in contrast of a measured image. Thus, the sort number etched on the semiconductor wafer is difficult to measure.

In order to prevent a decrease in resolution caused by deteriorated contrast due to irregular reflection beam components, an incident angle of a measurement beam to the semiconductor wafer is reduced and a bright field measurement is performed. In the bright field measurement, however, if a portion to be measured has a small three-dimensional pattern or a small step of the pattern, the judgement is disturbed.

SUMMARY OF THE INVENTION

The present invention has been made to solve the above-mentioned problems, and has as its object to provide an image reading apparatus which can obtain a high-contrast image with a high resolution even if irregular reflection considerably occurs and/or a step is small.

BRIEF DESCRIPTION OF THE DRAWINGS

FIGS. 1 and 2 show a sort number reading apparatus for a semiconductor wafer according to an embodiment of the present invention, in which FIG. 1 is a schematic view showing an overall arrangement, and FIG. 2 is a view showing the relationship between a region to be measured of a semiconductor wafer and an incident beam spot.

DETAILED DESCRIPTION OF THE PREFERRED EMBODIMENTS

Figure 3:
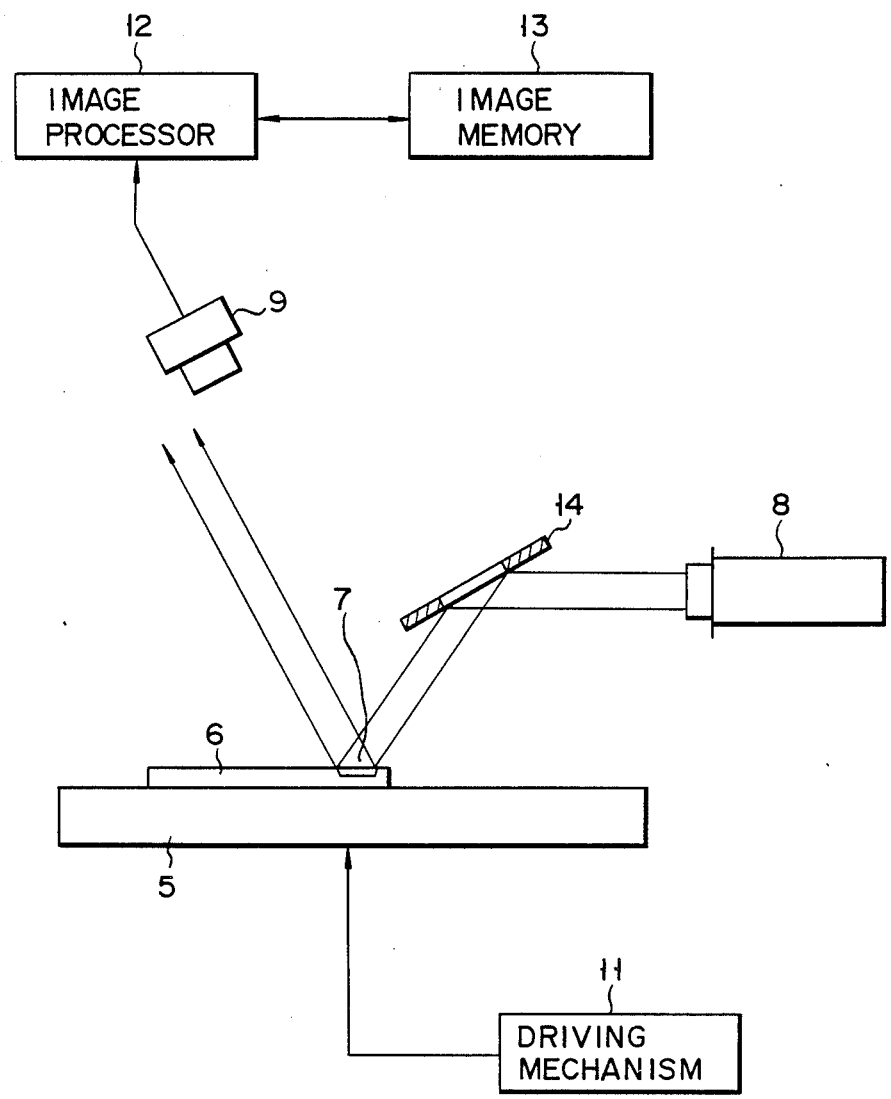
FIG. 3 is a schematic view showing a sort number reading apparatus according to another embodiment of the present invention.

A case will be described with reference to the accompanying drawings, wherein an image reading apparatus according to an embodiment of the present invention is applied to a sort number reading apparatus for a semiconductor wafer.

In FIG. 1, reference numeral 5 denotes a wafer table, which can be rotated by a driving mechanism 11. The table 5 may be fixed to a known X-Y table to be movable in X and Y directions. A semiconductor wafer 6 is horizontally fixed on the wafer table 5. The wafer 6 is a known dish-shaped one which is partially, linearly notched to form an orientation flat surface. A region 7 to be measured is defined at the edge, along the orientation flat surface of the wafer 6. A mark such as letters or symbols representing a wafer sort is etched on the region 7. In this embodiment, the mark is formed by a plurality of numerals aligned along the orientation flat surface. Each numeral is constituted by a continuous groove or a large number of discontinuous dot recesses. Dots are aligned in an array or in a plurality of arrays to draw a numeral much as Roman numeral. The mark can be etched by a laser beam. In this case, the etching method includes soft marking wherein grooves or recesses are formed shallow (0.2 to 0.8 micron) and hard marking wherein they are formed deep micron or more). Bar codes may be used instead of numerals.

A measurement light source 8 and an image detector, e.g., a CCD camera 9, are arranged above the semiconductor wafer 6. The measurement light source 8 comprises a halogen lamp for emitting an incoherent beam, e.g., a white light beam, and a slit for defining the beam emitted from the lamp into a parallel slit beam. The dimensions of the spot of the slit beam are, e.g., 2 cm $\times$ 0.5 cm, so that the slit beam can entirely radiate the region 7 without being scanned. The light source 8 is arranged so that an optical axis a of the parallel beam emitted therefrom is inclined with respect to the wafer surface. As a result, the beam is incident on the upper surface of the semiconductor wafer 6 at a predetermined incident angle $\theta$. The incident angle 8 preferably falls within the range of 60° to 80°.

The CCD camera 9 has its light-receiving surface at a position slightly offset from an optical axis b of a regular reflection beam so as not to receive a regular reflection beam of the incident beam. More specifically, a central optical axis c of the light-receiving surface of the CCD camera 9 is offset from the optical axis b of the regular reflection beam by a very small angle $\theta_1$. This angle is preferably decreased as much as possible as long as the regular reflection beam is not incident on the CCD camera 9. In practice, the angle $\theta_1\theta$ is preferably set within the range of 2° to 5°.

The CCD camera 9 is connected to a known image processor 12 and image memory 13. The mark of the region 7 picked up by the CCD camera 9 is subjected to image processing by the image processor 12 and the image memory 13.

A light-shielding plate 10 for shielding a peripheral beam (a beam demitted from the light source 8 and radiated on a portion outside the region to be measured of the wafer) of the measurement beam or slit beam from becoming incident on the wafer is arranged between the measurement light source 8 and the semiconductor wafer 6. The peripheral or ambient weak beam emitted from the light source 8 is prevented from becoming incident on the semiconductor wafer by the light-shielding plate 10. Therefore, a decrease in resolution caused by incidence of a regular reflection beam of the peripheral beam through an optical axis e can be prevented. The light-shielding plate 10 is preferably arranged near the semiconductor wafer as possible so as to prevent the peripheral beam from becoming incident on the wafer. However, in this case, a means for preventing a beam reflected by the light-shielding plate 10 from becoming incident on the CCD camera 9 must be arranged. For this purpose, a hood is preferably attached to the CCD camera or the light-shielding plate is preferably formed of a light absorbing member so as to prevent incidence of an unnecessary beam on the CCD camera. The light-shielding plate 10 can be formed by an elongated rectangular plate, so that a slit peripheral beam is cut by its one longer side edge. The light-shielding plate 10 need only be arranged at one side of the slit beam, as shown in FIG. 1. More specifically, in this embodiment, since the optical axis c of the CCD camera 9 is offset upward from the optical axis b of the regular reflection beam by the small angle θ1 the light-shielding plate 10 is arranged to cut a peripheral beam below the measurement beam. In particular, it is preferable that the peripheral beam is prevented from being incident on the orientation flat edge of the semiconductor wafer. The light-shielding plate 10 may be preferably treated with a block paint to absorb the light.

As described above, since the CCD camera 9 is arranged so as not to receive a regular reflection beam from the region to be measured and so as to receive a reflection beam by the mark other than the regular reflection beam, a soft-patterned mark can be measured with high accuracy. A hard-patterned mark can also be measured like in the conventional apparatus.

In this embodiment, the light source 8 and the semiconductor wafer 6 are fixed in position, and the spot of the slit beam is set to have substantially the same dimensions as those of the region to be measured. Alternatively, the beam spot size may be reduced, and the semiconductor wafer may be moved in the X and/or Y direction so a to scan the region to be measured with a small spot. In this case, after image data for one region of the CCD camera is processed by the image processor 12, this data is stored in the image memory 13. After images of the entire region are picked up, the image data are synthesized to perform checking.

Another embodiment will be described below with reference to FIG. 3.

The same reference numerals in FIG. 3 denote essentially the same parts as in the above embodiment, and a detailed description thereof will be omitted.

A light source 8 is arranged to be able to emit a parallel slit beam almost parallel to a semiconductor wafer 6. A reflection mirror 14 is arranged in front of the light source 8 so as to reflect a beam emitted from the light source 8 toward a region to be measured of the semiconductor wafer 6. The reflection mirror has a reflection surface at its center in correspondence with the region to be measured, and a light-absorbing member is arranged around the reflection surface. With this structure, a peripheral beam of the measurement beam is absorbed by the light-absorbing member, and is prevented from being incident on the region to be measured of the semiconductor wafer. Therefore, no light-shielding plate is required.

In this embodiment, recesses or grooves are formed as a pattern for identifying a sort on a semiconductor wafer as a member to be measured. However, this mark may be formed of projections or ridges. That is, a small three-dimensional pattern need only be formed on the surface of a member to be measured.

What is claimed is:

1. A combination of a member to be measured having on one major surface a region to be measured having a pattern formed by etching a plurality of recessed characters aligned at least in an array; and an image reading apparatus, said image reading apparatus comprising:

radiation means for simultaneously radiating, onto the pattern, an incoherent parallel light beam having a radiation spot of dimensions corresponding to those of the region to be measured;

measurement means, having a light-receiving surface which is shifted from an optical axis of a regular reflection beam so as to receive a reflection beam off-set from the regular reflection beam by the region to be measured, for measuring the pattern on said member of the received beam; and block means, arranged between said radiation means and the member to be measured, for preventing a peripheral beam of the parallel light beam from being incident on the region to be measured;

wherein said light-receiving surface of said measurement means has an angle of 2° to 5° with respect to the optical axis of the regular reflection beam from the pattern.

2. An apparatus according to claim 1 wherein said radiation means is arranged with respect to the member to be measured so that the measurement beam is incident on the pattern to have an incident angle of 60° to 80°.

3. An apparatus according to claim 1, further comprising means for fixing the member to be measured so as not to allow movement of the member to be measured during measurement of the pattern.

4. An apparatus according to claim 1, wherein said blocking means comprises a light-shielding member for preventing incidence, on the member to be measured, of a peripheral beam component of the measurement beam in a direction offset from the optical axis of the regular reflection beam by said light-receiving surface of said measurement means.

5. A combination according to claim 1, wherein the recessed character has a depth of about 0.2 to 0.8 micron.

6. A combination according to claim 5, wherein the member to be measured has a semiconductor wafer having an orientation flat surface, and the plurality of recessed characters are aligned along the orientation flat surface to constitute a mark indicating quality of said semiconductor wafer as a whole.

* * * * *